(12) United States Patent
Watabe (10) Patent No.: US 12,263,809 B2
(45) Date of Patent: Apr. 1, 2025

(54) COMMUNICATION DEVICE, SMART KEY DEVICE, AND COMMUNICATION METHOD

(71) Applicant: DENSO TEN Limited, Kobe (JP)

(72) Inventor: Hiroyuki Watabe, Kobe (JP)

(73) Assignee: DENSO TEN Limited, Kobe (JP)

( * ) Notice: Subject to any disclaimer, the term of this patent is extended or adjusted under 35 U.S.C. 154(b) by 282 days.

(21) Appl. No.: 17/879,879

(22) Filed: Aug. 3, 2022

(65) Prior Publication Data

US 2023/0311809 A1   Oct. 5, 2023

(30) Foreign Application Priority Data

Mar. 31, 2022   (JP) ................... 2022-059277

(51) Int. Cl.

| | | |
|---|---|---|
| *B60R 25/24* | (2013.01) | |
| *B60R 25/01* | (2013.01) | |
| *B60R 25/04* | (2013.01) | |
| *B60R 25/20* | (2013.01) | |
| *H02N 2/18* | (2006.01) | |
| *G07C 9/20* | (2020.01) | |

(52) U.S. Cl.
CPC .............. *B60R 25/24* (2013.01); *B60R 25/01* (2013.01); *B60R 25/04* (2013.01); *B60R 25/209* (2013.01); *H02N 2/186* (2013.01); *G07C 9/20* (2020.01)

(58) Field of Classification Search
CPC ......... B60R 25/24; B60R 25/01; B60R 25/04; B60R 25/209; B60R 25/248; B60R 2025/0405; G07C 9/20; G07C 2009/0038; G07C 9/00944; G07C 2009/00579; H10N 35/101; H02N 2/186
See application file for complete search history.

(56) References Cited

U.S. PATENT DOCUMENTS

2017/0160786 A1* 6/2017 Ji .................... G07C 9/00309
2018/0072268 A1* 3/2018 Lee .................. G07C 9/00309

FOREIGN PATENT DOCUMENTS

| | | |
|---|---|---|
| DE | 202010010892 U1 | 11/2011 |
| DE | 112017008294 T5 | 10/2020 |
| DE | 102021109926 A1 | 11/2021 |
| JP | 2014-172578 A | 9/2014 |

OTHER PUBLICATIONS

KR 20090107831 A with English translation; date filed Apr. 10, 2008; date published Oct. 14, 2009. (Year: 2009).*

* cited by examiner

*Primary Examiner* — Calvin Cheung
(74) *Attorney, Agent, or Firm* — Oliff PLC (57) ABSTRACT

A communication device according to one aspect of embodiments includes a controller. In a case where vibration of the communication device is detected, the controller allows execution of a communication process with a communication target device.

7 Claims, 8 Drawing Sheets

COMMUNICATION DEVICE, SMART KEY DEVICE, AND COMMUNICATION METHOD

CROSS-REFERENCE TO RELATED APPLICATION

This application is based upon and claims the benefit of priority of the prior Japanese Patent Application No. 2022-059277, filed on Mar. 31, 2022, the entire contents of which are incorporated herein by reference.

FIELD

The embodiments discussed herein are directed to a communication device, a smart key device, and a communication method.

BACKGROUND

Conventionally, various technologies are proposed in which a vehicle and a communication device such as a smart key carried by a user of the vehicle communicate with each other to be able to, for example, lock/unlock the vehicle, start up the vehicle, or the like (see Japanese Laid-open Patent Publication No. 2014-172578, for example).

Incidentally, in a communication device such as a smart key according to the conventional technologies, a communication process for transmitting an electrical wave for communication is always executed (including intermittently continuous execution). However, in a case of such a configuration for always executing the above-mentioned communication process, the communication process is executed even when the communication is needless, in other words, communication is not necessary, for example, and thus there has been a room for improvement therein.

SUMMARY

A communication device according to one aspect of embodiments includes a controller. In a case where vibration of the communication device is detected, the controller allows execution of a communication process with a communication target device.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENTS

Hereinafter, embodiments of a communication device, a smart key device, a smart key system, and a communication method will be described in detail with reference to the accompanying drawings. Moreover, the disclosed technology is not limited to the embodiments described below.

First Embodiment

Outline of Communication Method Executed by Communication Device

Figure 1:
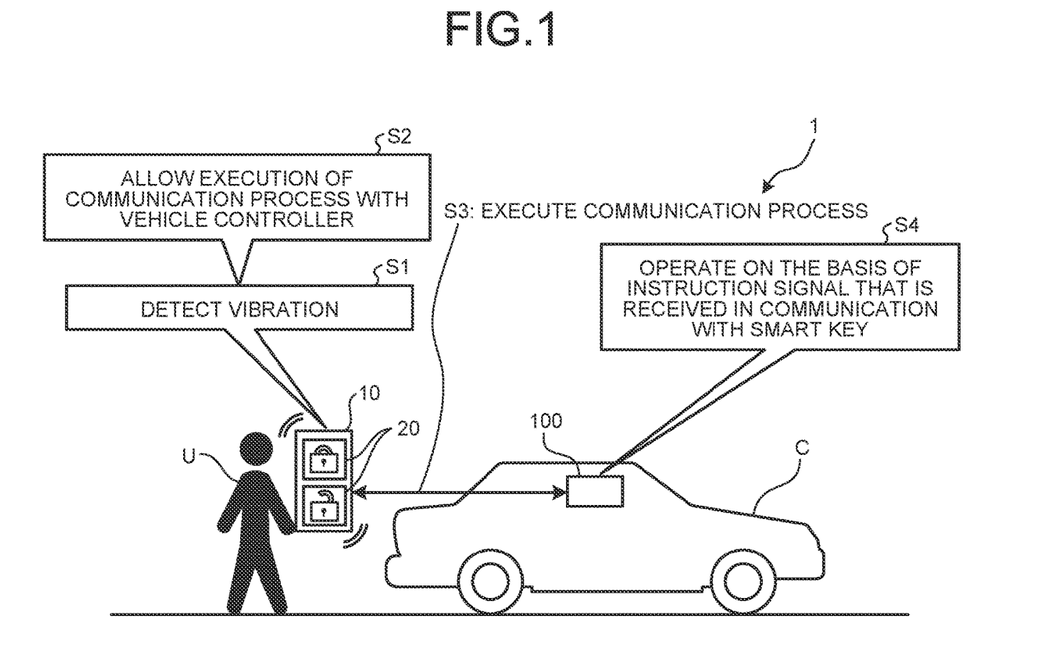
FIG. 1 is a diagram illustrating the outline of a communication method according to a first embodiment.

Hereinafter, first, the outline of communication method to be executed by a communication device according to a first embodiment will be explained with reference to FIG. 1. FIG. 1 is a diagram illustrating the outline of the communication method according to the first embodiment.

Hereinafter, a case will be explained as one example in which a communication system 1 according to the first embodiment is employed for a communication system of a vehicle C. A communication system of the vehicle C according to the present embodiment is a smart key system in which a communication device 10 (namely, smart key) carried by a user U of the vehicle C and a vehicle controller 100 provided in the vehicle C communicate with each other in a wireless manner to execute locking/unlocking of the vehicle C, opening/closing of a door, starting up of the vehicle C, and the like without insertion of an engine key of the vehicle C into a key cylinder there.

Specifically, as illustrated in FIG. 1, the communication system 1 according to the first embodiment includes the communication device 10 and the vehicle controller 100.

The communication device 10 is a device that communicates with the vehicle controller 100 and the like, specifically, is a portable smart key device that is carried (brought) by the user U of the vehicle C. Hereinafter, the communication device 10 may be referred to as "smart key 10". The smart key 10 is also denoted as a remote key or a wireless key, and wirelessly transmits an operation instruction signal to the vehicle C.

The smart key 10 includes an operation unit 20. The operation unit 20 receives a user operation that orders execution of a communication process for the vehicle controller 100. Examples of contents of the communication processes that are ordered to the operation unit 20 are processes such as transmitting of instruction signals for locking/unlocking of the vehicle C, opening/closing of a door, and starting up the vehicle C; however, these are merely examples and not limited thereto. Note that a detailed configuration of the smart key 10 will be mentioned later with reference to FIG. 2 and the like.

The vehicle controller 100 is provided in the vehicle C. The vehicle controller 100 controls a door, a drive source (engine and/or electric motor), and the like of the vehicle C, for example. The vehicle controller 100 communicates with the smart key 10 so as to execute a process (for example, locking process) in response to an instruction signal transmitted from the smart key 10, a process for transmitting information indicating a vehicle state (for example, locked state of door and the like) to the smart key 10, and the like.

Depending on a smart key system (communication system 1), when an operation switch provided in the vehicle C is operated, an on-vehicle device (vehicle controller 100) transmits a signal according to the operation to the smart key 10 by using short-distance wireless communication, the smart key 10 having received the signal transmits an identification signal of the smart key 10 and the like to the on-vehicle device, and if the identification signal coincides, in other words, is determined that an operation is performed by the right user U (user around vehicle with right smart key 10), executes an operation according to the operated operation switch (hereinafter, this smart key system may be referred to as "vehicle switch cooperation-type smart key system"). For example, in such a vehicle switch cooperation-type smart key system, in a state where the smart key 10 is around a vehicle, if an engine starting switch (push button not requiring key and the like) is operated, an engine is started up, and if a door knob is gripped, a door is unlocked. Note that detailed configuration of the vehicle controller 100 will be mentioned later with reference to FIG. 4 and the like.

Incidentally in a smart key according to a conventional technology, a communication process for transmitting an electrical wave for communication is always executed. Thus, for example, even when the user U does not drive the vehicle C and a smart key is in a position (home of user and the like) separated from the vehicle C, in other words, even when communication with the vehicle controller 100 is needless, the communication process is executed in the smart key.

Moreover, the smart key according to the conventional technology includes a battery so as to execute the communication process by using electric power supplied from the battery. Thus, if the communication process is always executed as described above, whole of stored electric power in the battery is used depending on a use state and the execution of the communication process is suddenly stopped, and thus locking/unlocking of the vehicle and the like becomes impossible.

Additionally, in these years, there presents a method of a so-called relay attack for stealing the vehicle C while exploiting a smart key in which a communication process is always executed. The relay attack is performed by relaying, with the use of a repeater, communication between a smart key in a home and a vehicle controller of a vehicle parked in a garage, so as to pretend that the smart key is near the vehicle (same as state where right vehicle owner is near vehicle), and thus incorrectly causes a smart key system to execute an unlocking operation (unlocking a door when the smart key approaches a range in which the smart key and the vehicle controller are able to communicate with each other), or to execute an engine starting operation (starting up an engine when an engine starting switch (push button and the like) is operated in a state where a smart key is in a range in which the smart key and the vehicle controller are able to communicate with each other). This is a theft method exploiting the fact that a communication process is always executed in a smart key, and thus countermeasure has been desired.

Therefore, in the smart key 10 according to the present embodiment, a communication process is executed only when necessary so as to prevent execution of needless communication processes, and further to reduce power consumption and to prevent theft of the vehicle C.

Specifically, the smart key 10 detects vibration of the smart key (communication device) 10 (Step S1). In the smart key 10, a vibration powered generator is mounted (built therein), and the smart key 10 detects vibration of the smart key 10 on the basis of a power generating state of the above-mentioned vibration powered generator.

Specifically, for example, if the user U who is carrying the smart key 10 performs an operation of moving his/her hand having the smart key 10, for example, waving his/her hand, a vibration powered generator generates power by vibration of the above-mentioned operation. In a power generating state where power is being generated in the vibration powered generator, the smart key 10 detects vibration of the smart key 10.

When performing a desired operation such as locking/unlocking of the vehicle C, the user U has the smart key 10 so as to perform an operation such as pushing the operation unit (operation button) 20, and thus the smart key 10 is accordingly vibrated in accordance with a behavior of taking the key and/or the operation by the user U. As a result, by the above-mentioned method, the smart key 10 is capable of detecting a state requiring communication.

Next, in a case where vibration is detected, the smart key 10 allows execution of a communication process with the vehicle controller 100 (Step S2). For example, a communication controller (see FIG. 2) that executes a communication process with the vehicle controller 100 is provided in the smart key 10, and in a case where detecting vibration, the communication controller executes control to allow execution of the communication process. Moreover, in a case where a configuration (configuration in which electric power to be supplied to communication controller is electric power generated by vibration powered generator of smart key 10) is employed in which a communication process is executed by using electric power generated by a vibration powered generator provided in the smart key 10, it is also possible that execution of a communication process is allowed when vibration is detected.

Next, the smart key 10 executes a communication process with the vehicle controller 100 (Step S3). For example, the smart key 10 executes a communication process according to a content received by the operation unit 20. For one example, in a case where receiving a user operation indicating locking or the vehicle C by using the operation unit 20, the smart key 10 transmits, to the vehicle controller 100, an instruction signal that orders locking of the vehicle C with wireless communication. Furthermore, the smart key 10 transmits, to the vehicle controller 100, communication for reporting presence of the smart key 10, or various kinds of information for authentication as needed or in response to a request signal transmitted from the vehicle controller 100.

The vehicle controller 100 of the vehicle C operates on the basis of an instruction signal that is received in communication with the smart key 10 (Step S4). For one example, in a case where receiving a signal that orders locking of the vehicle C in communication with the smart key 10, the vehicle controller 100 control a door lock unit (see FIG. 4) of the vehicle C to execute locking. For another example, the vehicle controller 100 executes locking/unlocking control of the door lock unit (see FIG. 4) of the vehicle C or start control of an engine thereof, in accordance with communication or an authentication signal that indicates presence of the smart key 10 and an operation state by the user U or the like of the operation switch (see FIG. 4) provided in the vehicle.

As described above, in a case where vibration of the smart key 10 is detected, in other words, in a case where the fact that the user U takes the smart key 10 in his/her hand for executing communication (various operations of smart key and the like) is detected by vibration, or the fact that the user U operates the operation unit (operation button) 20 is detected by vibration, the smart key 10 according to the present embodiment is configured to execute a communication process with the vehicle controller 100 that is a communication target device. Note that in a state where the user U does not have the smart key 10, for example, in a situation where the key is put on a table, the smart key 10 does not vibrate so that a communication process with the vehicle controller 100 is not executed.

Thus, in the present embodiment, a communication process is able to be executed only when necessary, and further to prevent needless communication processes. Therefore, in the smart key 10 according to the present embodiment, it is possible to reduce power consumption, and further to reduce a case where locking/unlocking of the vehicle C is disabled due to shortage of an electric storage amount of a battery.

Moreover, in the present embodiment, it is possible to effectively prevent theft of the vehicle C with the use of a method such as the above-mentioned relay attack. In other words, the smart key 10 becomes capable of executing a communication process only after a legitimate user takes the smart key 10 in his/her hand in order to use the smart key 10, or operates the operation unit (operation button) 20 or the like and thus the smart key 10 vibrates. Thus, the smart key 10 does not transmit, to the vehicle C, a release signal and the like unless a larcenist or the like gets and vibrates the smart key 10 itself, so that it is possible to effectively prevent theft of the vehicle C with the use of a method such as the above-mentioned relay attack.

Overall Configuration of Communication System

FIG. 1 is also a diagram illustrating a configuration example of the communication system 1 according to the present embodiment. In block diagrams illustrated in FIG. 1 and the like, configuration elements needed for explaining features of the embodiments are indicated, and description of general configuration elements is appropriately omitted.

The illustrated components of the devices are functionally conceptual, and thus they are not to be physically configured as illustrated in the drawings. Specific forms of distribution and integration of the configuration elements of the illustrated devices are not limited to those illustrated in the drawings, and all or some of the devices can be configured by separating or integrating the apparatus functionally or physically in any unit, according to various types of loads, the status of use, etc.

In explanation of the drawings, explanation of already-explained configuration elements may be simplified or omitted.

As illustrated in FIG. 1, the communication system 1 according to the embodiment includes the smart key 10 and the vehicle controller 100 that is provided in the vehicle C. The smart key 10 and the vehicle controller 100 can be communicably connected with each other by using, for example, short-distance wireless communication within a distance range in which various functions of a smart key appropriately operates (for example, distance in which legitimate user is able to recognize state of vehicle C (for example, approximately 10 m)).

Configuration of Smart Key

Figure 2:
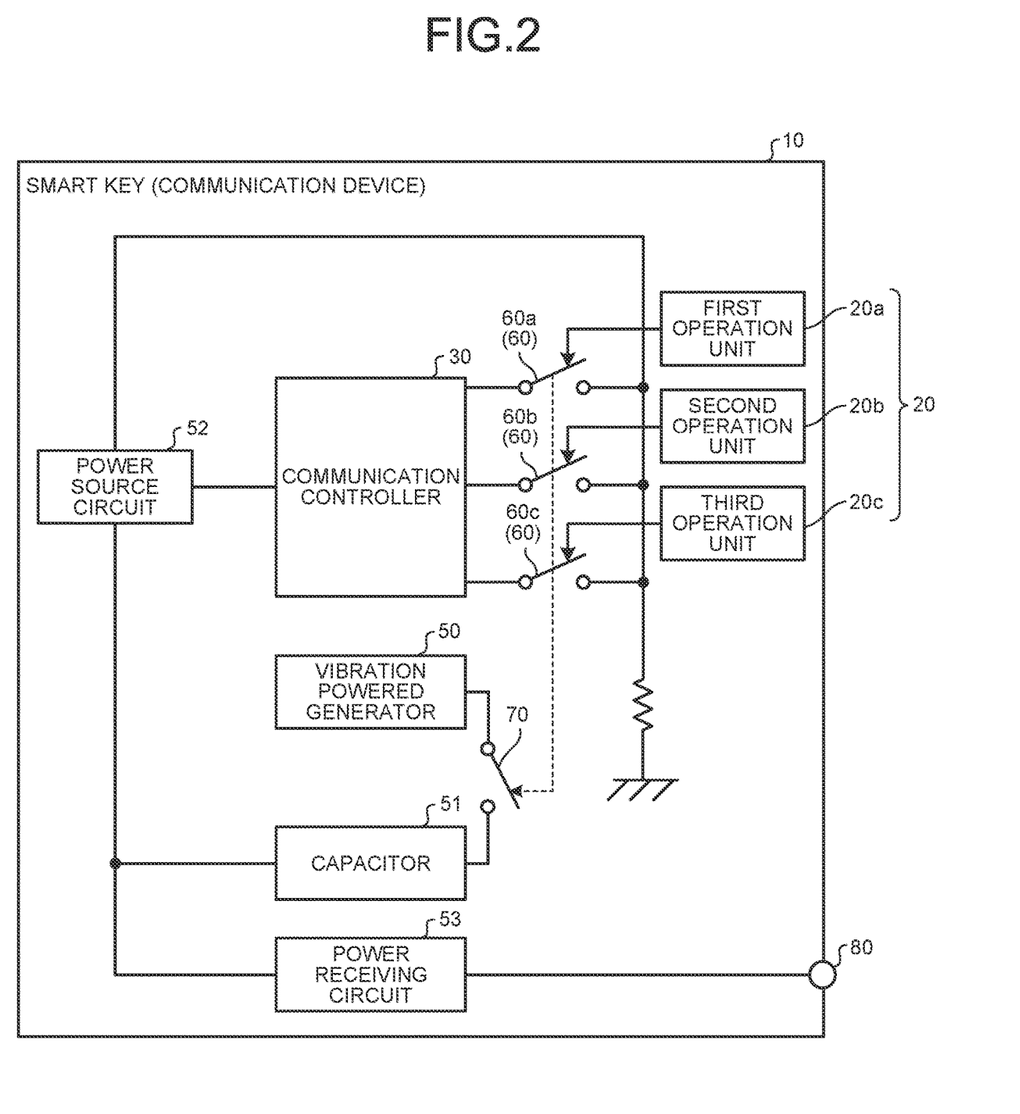
FIG. 2 is a block diagram illustrating a configuration example of a smart key.

A configuration of the smart key 10 that is a communication device will be explained with reference to FIG. 2. FIG. 2 is a block diagram illustrating a configuration example of the smart key 10. As illustrated in FIG. 2, the smart key 10 includes the above-mentioned operation unit 20, a communication controller 30, a vibration powered generator 50, a capacitor 51, a power source circuit 52, and a power receiving circuit 53.

The operation unit 20 is configured to receive a user operation that orders execution of a communication process, and is constituted of a plurality of operation buttons (push buttons) corresponding to instruction contents. The operation unit 20 includes a first operation unit 20a, a second operation unit 20b, and a third operation unit 20c. In the present example, the first operation unit 20a is for executing an operation for locking a door of the vehicle C, the second operation unit 20b is for executing an operation for unlocking a door of the vehicle C, and the third operation unit 20c is for executing an operation for opening/closing a door of the vehicle C.

In addition to or instead of the above-mentioned operations, the operation unit 20 may include, for example, an operation for starting up a drive source (engine and the like) of the vehicle and operation units corresponding to operations having other contents; and further the number thereof may be arbitrary set in accordance with the number of functions to be operated and the like. Hereinafter, in a case where operation units 20a to 20c are explained without particularly distinguishing them from each other, each of them may be simply referred to as "operation unit 20".

The communication controller 30 executes a communication process related to communication with the vehicle controller 100 (see FIG. 1) of the vehicle C and the like. Note that a configuration of the communication controller 30 will be mentioned later with reference to FIG. 3.

A switch 60 is connected to the communication controller 30. The switch 60 is turned ON/OFF in response to a user operation for the operation unit 20. The switch 60 is turned into an ON state in a case where the user U operates the operation unit 20 (for example, in a case where push button is being pushed), and further turned into an OFF state in a case where the user U does not operate the operation unit 20.

The number of the switches 60 is two or more in correspondence with the number of the operation units 20, more specifically, including the switches 60 include a first switch 60a, a second switch 60b, and a third switch 60c. The first switch 60a cooperates with an operation for the first operation unit 20a, and is turned ON in a case where the user U is operating the first operation unit 20a. The second switch 60b cooperates with an operation for the second operation unit 20b, and is turned ON in a case where the user U is operating the second operation unit 20b. The third switch 60c cooperates with an operation of the third operation unit 20c, and is turned ON in a case where the user U is operating the third operation unit 20c. When the switch 60 (60a, 60b, 60c is turned ON, the communication controller 30 detects that the corresponding operation unit 20 (20a, 20b, 20c) is being operated by the user U.

The vibration powered generator 50 is a generator that generates power by vibration applied to the vibration powered generator 50, in other words, vibration of the smart key 10 in which the vibration powered generator 50 is provided, so as to supply electric power to the smart key 10. In other words, the vibration powered generator 50 executes electric-power supply to the smart key 10 by using vibration of the smart key 10 as power source.

Generators having various electricity-vibration conversion-types may be employed for the vibration powered generator 50. For example, for the vibration powered generator 50, a magnetic-guide type generator in which a magnet arranged in a coil is moved by vibration so as to generate power or a coil is moved in a magnetic field that is formed by a magnet, a magneto-striction type generator in which a magneto-striction material in a coil is curved by vibration so as to generate power, or the like may be employed.

The capacitor 51 stores therein electric power generated by the vibration powered generator 50. Electric power is supplied to the smart key 10 from the above-mentioned capacitor 51, which is to be mentioned later. Note that the capacitor 51 is one example of an electric condenser. Furthermore, a rectifier circuit, a voltage adjusting circuit (constant-voltage circuit), and the like that are needed for storing into the capacitor 51 are provided in the vibration powered generator 50.

A cooperation switch 70 is interposed between the vibration powered generator 50 and the capacitor 51. The cooperation switch 70 is a switch (cooperation switch) that corporates with the switch 60. Specifically, the cooperation switch 70 is turned into an ON state in accordance with operations of the plurality of operation units 20, and connects the vibration powered generator 50 and the capacitor 51 to each other so as to turn the capacitor 51 into a charged state.

More specifically, the cooperation switch 70 is turned ON (capacitor 51 is turned into charged state) when the switch 60 is turned ON (at least one of first, second, and third switches 60a, 60b, and 60c is turned ON), in other words, when the operation unit 20 is operated by the user U (at least one of first, second, and third operation units 20a, 20b, and 20c is operated). On the other hand, the cooperation switch 70 is turned OFF when the switch 60 is turned OFF (all of first, second, and third switches 60a, 60b, and 60c are turned OFF), in other words, when the operation unit 20 is not operated by the user U (all of first, second, and third operation units 20a, 20b, and 20c are not operated).

The power source circuit 52 is a circuit that supplies input electric power as power source of the communication controller 30 and the like, and includes necessary circuits such as a switching circuit that selects (connect/shut) an electric power supply line and a voltage converting circuit that converts a power-source voltage into a voltage that is appropriate for each electric power supply destination. For example, the power source circuit 52 converts electric power input from the capacitor 51 into a voltage that is appropriate for use in the communication controller 30 so as to supply the converted voltage to the communication controller 30. The power source circuit 52 supplies, as a power source of the communication controller 30 and the like, electric power (electric power received from vehicle C) that is input from the power receiving circuit 53 to be mentioned later.

Herein, a capacity of the capacitor 51 that supplies electric power to the communication controller 30 will be explained. A capacity of the capacitor 51 is able no be set to an arbitrary value depending on selection of a component type of a capacitor; however, in the present embodiment, the capacity is set to a value having an electric power amount so as to execute a communication process, whose extent (with needed margin degree) is that a series of processes (whose electric-power consumption amount is largest) of each operation function that is set in the communication controller 30 is able to be executed once after electric power supplied from the vibration powered generator 50 is stopped after vibration of the smart key 10 by the user U is stopped.

Thus, electric power needed for the communication process is able to be stably supplied to the communication controller 30 (generated electric power of vibration powered generator 50 changes depending on vibration state, and thus is unstable), and thus the communication controller 30 is capable of executing a stable communication process.

Additionally, in the power source circuit 52, a discharge circuit (constituted of switching circuit in which capacitor is arranged and the like) is provided, which discharges residual electric power of a capacitor 54 at a time point when execution of a series of communication processes by the communication controller 30 ends (the above-mentioned time point may be alternatively estimated as predetermined time interval elapsed from start of supply of electric power).

Thus, residual electric power is discarded after a communication process caused by an operation of the user U, so that it is possible to prevent a communication process for a suspicious operation/trick and the like (in other words, operation/trick, etc. leading to theft of vehicle C).

Moreover, a discharge circuit that discharges residual electric power of the capacitor 51 after a predetermined time interval (equal to or more than time interval from end of power generation by vibration powered generator 50 (in other words, time point when user U releases smart key 10) to time point when an operation by user U is supposed, and equal to or less than time interval (elapsed time interval from time when user U releases smart key 10) from end of power generation by vibration powered generator 50 to time point when occurrence of possibility of incorrect use is supposed to start) has elapsed is provided in the power source circuit 52 or the capacitor 51.

Therefore, residual electric power of the capacitor 51 is discarded within an appropriate time interval, so that it is possible to prevent a communication process with respect to the later suspicious operation/trick and the like.

In other words, a predetermined time interval has elapsed since end of power generation (in other words, time point when user U releases smart key 10) by the vibration powered generator 50, supply of electric power from the capacitor 51 to the communication controller 30 is then stopped, and thus a communication process is not executed in the communication controller 30. Therefore, for example, in a state where the smart key 10 is kept in a home (for example, being put on table), vibration is not applied to the smart key 10 unless the user U uses the key (namely, being kept in still state), and thus electrical wave for communication is not transmitted, so that it is possible to effectively prevent theft of the vehicle C with the use of a method such as the above-mentioned relay attack.

As described above, to the capacitor 51 according to the present embodiment, a discharge circuit having a predetermined time constant is connected, and thus residual electric power of the capacitor 51 is appropriately discarded (discharged), so that it is possible to further effectively prevent theft of the vehicle C.

Note that power is generated by vibration caused by picking up of and/or operation for the smart key 10, the generated power is stored in the capacitor 51, and thus it is possible to sufficiently deal with an operation of a legitimate user by appropriately setting a power generation capability, a setting of response time interval of the operation unit 20 (setting hold time interval of operation unit 20 to time interval needed for power generation), and the like.

Explanation is continued with reference to FIG. 2, the power receiving circuit 53 is a circuit that receives electric power supplied from the vehicle C, and further supplies the received electric power to a power source circuit. Note that the power receiving circuit 53 is one example of a power receiving unit.

The power receiving circuit 53 is electrically connectable to the vehicle C via a connector 80. Specifically, a power supply unit 107 (see FIG. 4) is provided on a side of the vehicle C, and the power supply unit 107 and the power receiving circuit 53 are electrically connected with the use of a connector or the like so that the power receiving circuit 53 receives electric power from the vehicle C.

Power supply from the vehicle C to the power receiving circuit 53 in the smart key 10 may be wired power supply with the use of a power source cable and the like as described above, or may be another type one such as a wireless power supply (wireless power supply such as electromagnetic induction type, magnetic field resonance type, and electric field coupling type).

Electric power received by the power receiving circuit 53 from the vehicle C is input to the power source circuit 52 without being stored in the capacitor 51 or the like, and is used as power source of the communication controller 30. Electric power from the vehicle C is used in a communication process (for example, authentication process, etc.) and the like, which is executed periodically or at random between the communication controller 30 of the smart key 10 and the vehicle C during travelling of the vehicle, this point will be mentioned later.

Figure 3:
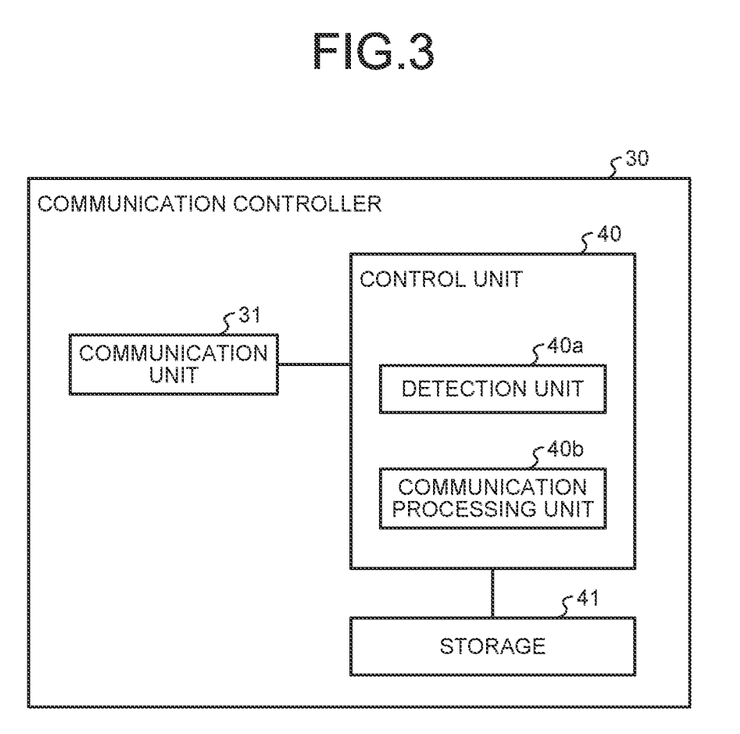
FIG. 3 is a block diagram illustrating a configuration example of a communication controller.

Herein, a configuration of the above-mentioned communication controller 30 will be explained with reference to FIG. 3. FIG. 3 is a block diagram illustrating a configuration example of the communication controller 30. As illustrated in FIG. 3, the communication controller 30 includes a communication unit 31, a control unit 40, and a storage 41.

The communication unit 31 is a communication interface that is connected to the vehicle controller 100 of the vehicle C to be able to communicate with each other to execute wireless communication, and transmits and receives various signals/data to and from the vehicle controller 100 with the use of a predetermined short-distance wireless communication system.

The storage 41 a storage constituted of a storage device such as a non-volatile memory and a data flash. The storage 41 stores therein various data, various programs, and the like. Note that in the present embodiment, instruction data transmitted to the vehicle C during operation of each of the operation units 20a, 20b, and 20c is stored in the storage 41.

The control unit 40 is a so-called controller, and includes a detection unit 40a; a communication processing unit 40b; a computer including, for example, a Central Processing Unit (CPU), a Read Only Memory (ROM), a Random Access Memory (RAM), an input/output port, and the like; and various circuits.

For example, a CPU of the computer reads and executes a program stored in a ROM so as to function as the detection unit 40a and the communication processing unit 40b of the control unit 40. All or a part of the detection unit 40a and the communication processing unit 40b of the control unit 40 may be constituted of hardware such as an Application Specific Integrated Circuit (ASIC) and a Field Programmable Gate Array (FPGA).

Next, a flow of an operation to be executed during transmission of an instruction signal to the vehicle C by each of the configuration elements illustrated in FIGS. 2 and 3 will be explained. Note that hereinafter, for convenience of explanation, explanation is performed while exemplifying an operation in a case where the user U operates the first operation unit 20a.

As illustrated in FIG. 2, in the smart key 10, when receiving a user operation with respect to the first operation unit 20a, the first switch 60a is turned ON, and further the cooperation switch 70 is turned ON in cooperation therewith.

When the user U picks up the smart key 10 with his/her hand, for example, the vibration powered generator 50 is vibrated along with vibration of the smart key 10, and the vibration powered generator 50 starts to generate electric power. Note that at this point, the cooperation switch 70 is in an OFF state, and the capacitor 51 is not charged with electric power generated by the vibration powered generator 50.

Subsequently, if the user U operates (for example, pushes) any of the operation units 20, the corresponding switch 60 is turned ON and further the cooperation switch 70 is also turned ON so that the capacitor 51 is charged with electric power generated by the vibration powered generator 50. Note that an operation for the operation unit 20 by the user U vibrates the vibration powered generator 50, thereby leading to power generation of the vibration powered generator 50.

With respect to an operation for the operation unit 20 by the user U, the communication controller 30 (detection unit 40a) determines which of the operation units 20 is operated. Note that to a terminal on an opposite side of the communication controller 30 of each of the switches 60, a voltage is applied from the power source circuit 52, if the switch 60 is turned ON, a terminal of the corresponding switch 60 on a side of the communication controller 30 becomes a high voltage (low voltage when switch is turned OFF), and thus the detection unit 40a is capable of determining which of the operation units 20 is operated by monitoring a change in the voltage.

The switch 60 is configured to hold a state at a time point of an operation for the operation unit 20 for a predetermined time interval (by using elastic body, latch mechanism, or the like), and when the communication controller 30 (detection unit 40a) determines the operated operation unit 20, electric power accumulated in the capacitor 51 by power generation of the vibration powered generator 50 is supplied to the power source circuit 52 and the communication controller 30.

The communication controller 30 (communication processing unit 40b) reads transmission instruction data from the storage 41 corresponding to the operated operation unit 20, and further causes the communication unit 31 to transmit the transmission instruction data to the vehicle C. In other words, the communication controller 30 transmits an operation instruction signal to the vehicle C by using electric power generated by the vibration powered generator 50.

As described above, the communication controller 30 is configured to execute communication with the use of electric power supplied from the power source circuit 52. Specifically, the detection unit 40a of the communication controller 30 detects vibration depending on presence/absence of power generation by the vibration powered generator 50, and further transmits detection result to the communication processing unit 40b. The communication processing unit 40b executes determination of whether or not transmission is possible on the basis of the detection result of vibration, if transmission is possible, reads instruction data corresponding to the operated switch 60 from the storage 41, and causes the communication unit 31 to transmit the instruction data to the vehicle C. In other words, presence/absence of vibration is determined by a power generating state of the vibration powered generator 50, and thus the vibration powered generator 50 also serves as a vibration sensor.

If the user U stops an operation for the operation unit 20, the cooperation switch 70 is turned into an OFF state, charging of the capacitor 51 with electric power generated by the vibration powered generator 50 is stopped. Next, electric power accumulated in the capacitor 51 is discharged by a discharge circuit in accordance with transmission of an instruction signal from the communication controller 30 to the vehicle C, and accumulated electric power of the capacitor 51 disappears.

Moreover, for example, in a case where the smart key 10 is left on a table while the vehicle C is being parked in a parking lot of a home (still state), the vibration powered generator 50 becomes a non-power generating state, the cooperation switch 70 becomes an OFF state, the capacitor 51 becomes a non-stored state, supply of electric power from the power receiving circuit 53 (where supply of electric power from the outside is absent) becomes an absent state, and transmission of electrical wave from the smart key 10 is stopped.

In other words, as an operation principle, the communication controller 30 is configured to detect vibration when the vibration powered generator 50 is in a power generating state, and further to transmit transmission instruction data to the vehicle C when detecting the vibration.

During travelling of the vehicle C (when engine is kept in started-up state), power source of the vehicle C is supplied to the power receiving circuit 53 via the connector 80, the electric power is supplied to the communication controller 30 via the power source circuit 52, and thus information (authentication information of smart key and the like) needed for starting up (keeping started-up state) of an engine is transmitted and received between the communication controller 30 and the vehicle C. In other words, the communication controller 30 transmits an instruction signal that is continuously transmitted for continuing drive of the vehicle C, with the use of electric power received by the power receiving circuit 53.

As described above, in a state where sufficient power generation by the vibration powered generator 50 is not expected (state is not able to be expected in which user U holds smart key 10 in his/her hand to apply sufficient vibration to smart key 10, state where vehicle C is running), the power receiving circuit 53 is configured such that stable sufficient electric power is supplied to the power source circuit 52. Thus, transmission and reception of information for starting up an engine between the communication controller 30 and the vehicle C during travelling (when engine is kept in started-up state) is stably executed.

Next, for convenience of comprehension, an operation in a case where the user U operates the first operation unit 20a (namely, in case where user U locks door of vehicle C by using smart key 10) will be explained.

When receiving a user operation (door locking operation of vehicle C using smart key 10 by user U) for the first operation unit 20a, the first switch 60a is turned ON, and the cooperation switch 70 is turned ON in cooperation therewith. The ON states of the first switch 60a and the cooperation switch 70 are kept for a predetermined time interval by a time limit holding mechanism, a holding circuit, or the like.

The smart key 10 is held in a hand of the user U and an operation is performed for the first operation unit 20a, vibration is accordingly applied to the smart key 10, and thus the vibration powered generator 50 generates power. Electric power generated by the vibration powered generator 50 is supplied to the capacitor 51 via the cooperation switch 70, and is stored therein. The electric power stored in the capacitor 51 is supplied to the power source circuit 52, an appropriate power source process such as a conversion into a rated voltage is executed thereon, and is supplied to the communication controller 30. Next, the communication controller 30 to which power source is supplied starts to operate.

Voltage is applied to terminals of the switches 60 on an opposite-side of the communication controller 30 from the power source circuit 52, the first switch 60a alone is turned ON, and thus with respect to voltages of terminals on a side of the communication controller 30 in the switches 60, the first switch 60a is a high voltage, and the second switch 60b and the third switch 60c are a low voltage. The communication controller 30 detects that the first switch 60a (corresponding to locking operation door of vehicle C) is operated based on input voltages of the terminals, reads out data on locking instruction of a door of the vehicle C from the storage 41, and causes the communication unit 31 to transmit the instruction data to the vehicle C.

If an operation of a user for the first operation unit 20a has ended, the first switch 60a and the cooperation switch 70 are turned into an OFF state after a predetermined hold time interval, and charging of the capacitor 51 is shut. Electric power stored in the capacitor 51 is discharged by a discharge circuit and the capacitor 51 becomes empty, and the communication controller 30 stops to operate, and communication is not executed thereafter.

Thus, in the present embodiment, it is possible to execute a communication process when it is necessary, and thus further to prevent execution of needless communication processes.

Note that in a case of a vehicle switch cooperation-type smart key system, as described above, the communication controller 30 is configured to execute communication indicating the above-mentioned presence of the smart key 10 (being in neighborhood of communication device on vehicle side), and further to execute communication of an answer signal or an identification/authentication signal in response to communication from a vehicle-side communication device, even without an operation by the operation unit 20. The cooperation switch 70 is configured to be controlled to be turned into an ON state also by vibration detection similarly to a case where the operation unit 20 is operated. According to such a configuration, in a case where the smart key 10 is vibrated, in other words, in a case where the right user U holds the smart key 10 in his/her hand, for example, the vehicle switch cooperation-type smart key system is configured to execute communication indicating presence of the smart key 10 (being in neighborhood of communication device on vehicle side), and further to execute communication of an answer signal or an identification/authentication signal in response to communication from a vehicle-side communication device. Thus, according to the above-mentioned configuration, needed and right communication is executed in the vehicle switch cooperation-type smart key system.

Configuration of Vehicle including Vehicle Controller

Figure 4:
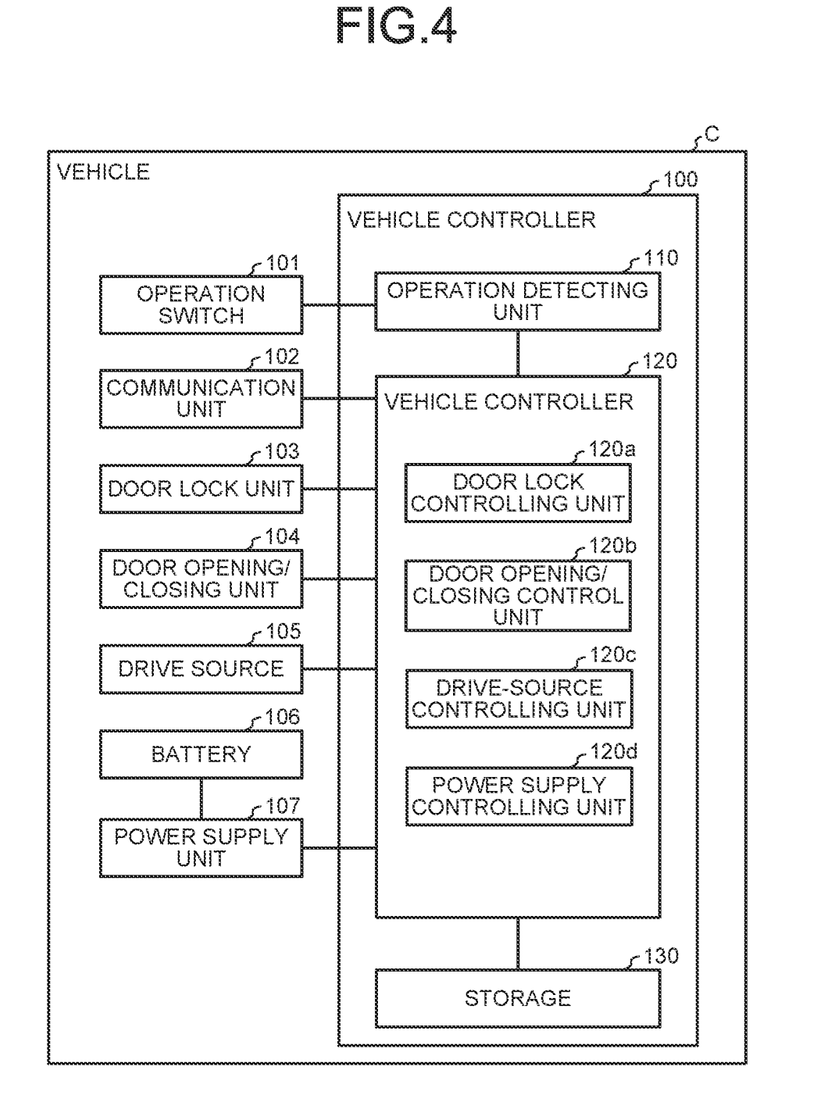
FIG. 4 is a block diagram illustrating a configuration example of a vehicle.

Next, a configuration of the vehicle C including the vehicle controller 100 will be explained with reference to FIG. 4. FIG. 4 is a block diagram illustrating a configuration example of the vehicle C. As illustrated in FIG. 4, the vehicle C includes the above-mentioned vehicle controller 100, an operation switch 101, a communication unit 102, a door lock unit 103, a door opening/closing unit 104, a drive source 105, a battery 106, and the power supply unit 107. Note that the vehicle controller 100 is one example of a communication target device, and is also one example of an on-vehicle device provided in the vehicle C.

The operation switch 101 is provided in the vehicle C so as to receive a user operation. In FIG. 4 for convenience of illustration, the operation switch 101 is indicated by using a single block, the operation switch 101 includes an engine starting switch that receives a start-up operation of an engine, a locking/unlocking switch that receives a locking/unlocking operation for the door lock unit 103, and the like. The operation switch 101 outputs a signal corresponding to the received operation to the vehicle controller 100. The operation switch 101 is one example of a vehicle-side operation unit.

The communication unit 102 is a communication interface that is connected to the communication controller 30 of the smart key 10 to be able to communicate with each other via wireless communication, so as to transmit and receive various signals and data to and from the communication controller 30 (communication unit 31).

The door lock unit 103 is a lock mechanism that locks or unlocks a door of the vehicle C. The door opening/closing unit 104 is an opening/closing mechanism that opens/closes a door of the vehicle C. The drive source 105 is a mechanism that outputs driving force for driving the vehicle C, and is an engine and/or an electric motor, for example.

The battery 106 supplies electric power to various devices and circuits provided in the vehicle C. The power supply unit 107 is connected to the battery 106. When being electrically connected to the smart key 10, the power supply unit 107 supplies, to the smart key 10 (precisely, power receiving circuit 53 (see FIG. 2)), electric power at the battery 106 in an appropriate mode (converting into rated voltage of smart key 10, for example).

The vehicle controller 100 includes an operation detecting unit 110, a vehicle controller 120, and a storage 130. For example, the storage 130 is a storage constituted of a storage device such as a non-volatile memory and a data flash. The storage 130 stores therein various data, various programs, and the like.

The vehicle controller 120 is, i.e. a controller (vehicle controller) for controlling a vehicle device, and includes a door lock controlling unit 120*a*, a door opening/closing control unit 120*b*, a drive-source controlling unit 120*c*, and a power supply controlling unit 120*d*. The operation detecting unit 110 and the vehicle controller 120 include a computer including, for example, CPU, ROM, RAM, an input/output port, and the like; and various circuits.

The CPU of the computer reads and executes a program stored in the ROM so as to function as the operation detecting unit 110, and the door lock controlling unit 120*a*, the door opening/closing control unit 120*b*, the drive-source controlling unit 120*c*, and the power supply controlling unit 120*d* of the vehicle controller 120. At least a part or all of the operation detecting unit 110, and the door lock controlling unit 120*a*, the door opening/closing control unit 120*b*, the drive-source controlling unit 120*c*, and the power supply controlling unit 120*d* of the vehicle controller 120 may be constituted of hardware such as ASIC and FPGA.

The operation detecting unit 110 detects an operation state of the operation switch 101. A signal corresponding to an operation received by the operation switch 101 is input to the operation detecting unit 110, and the operation detecting unit 110 outputs, to the vehicle controller 120, information indicating an operation state of the operation switch 101 on the basis of the signal. The above-mentioned operation state includes, for example, a state where an engine starting switch is operated and a state where a locking/unlocking switch is operated. The operation detecting unit. 110 is one example of a vehicle-side operation detecting unit.

The door lock controlling unit 120*a* of the vehicle controller 120 controls the door lock unit 103. For example, in a case where receiving a signal that orders locking of the vehicle C via communication with the communication controller 30 of the smart key 10, the door lock controlling unit 120*a* controls the door lock unit 103 so as to lock a door. In a case where receiving the signal that orders unlocking of the vehicle C, the door lock controlling unit 120*a* controls the door lock unit 103 so as to unlock the door.

The door opening/closing control unit 120*b* controls the door opening/closing unit 104. For example, in a case where receiving a signal that orders opening/closing of a door of the vehicle C via communication with the communication controller 30 of the smart key 10, the door opening/closing control unit 120*b* controls the door opening/closing unit 104 so as to execute opening/closing of a door.

The drive-source controlling unit 120*c* controls the drive source 105. For example, in a case where receiving a signal that orders starting up of the vehicle C via communication with the communication controller 30 of the smart key 10, the drive-source controlling unit 120*c* executes start-up control on the drive source 105 so as to start up the vehicle.

In the vehicle switch cooperation-type smart key system, the vehicle controller 120 controls the vehicle C in accordance with a data communication situation of the smart key 10 and an operation state (in other words, detection content by operation detecting unit 110) of the operation switch 101.

Specifically, in the vehicle switch cooperation-type smart key system, as described above, in a case where, for example, the right the user U has the smart key 10 in his/her hand and thus the smart key 10 is vibrated, communication for indicating that the smart key 10 is present near the vehicle controller 100 and communication of an answer signal and an identification/authentication signal from the vehicle controller 100 to the smart key 10 are executed. Under a communication situation in which the above-mentioned communication is executed and in a case where the operation switch 101 is operated, the vehicle controller 120 controls (for example, control for starting engine, locking/unlocking and opening/closing door, and the like) the vehicle C in accordance with the operation. Conversely, in a case of a communication situation in which the above-mentioned communication is not executed, the vehicle controller 120 does not control (for example, control for starting up engine and the like) the vehicle C even if the operation switch 101 is operated. Thus, unless a larcenist or the like gets and vibrates the smart key 10, the vehicle C is not controlled, so that it is possible to effectively prevent theft of the vehicle C with the use of a method such as the above-mentioned relay attack.

The power supply controlling unit 120*d* controls the power supply unit 107. For example, in a case where detecting that the power supply unit 107 is electrically connected to the smart key 10, the power supply controlling unit 120*d* controls the power supply unit 107 so as to supply electric power of the battery 106 to the smart key 10 via the power supply unit 107.

Control Process of Smart Key

Figure 5:
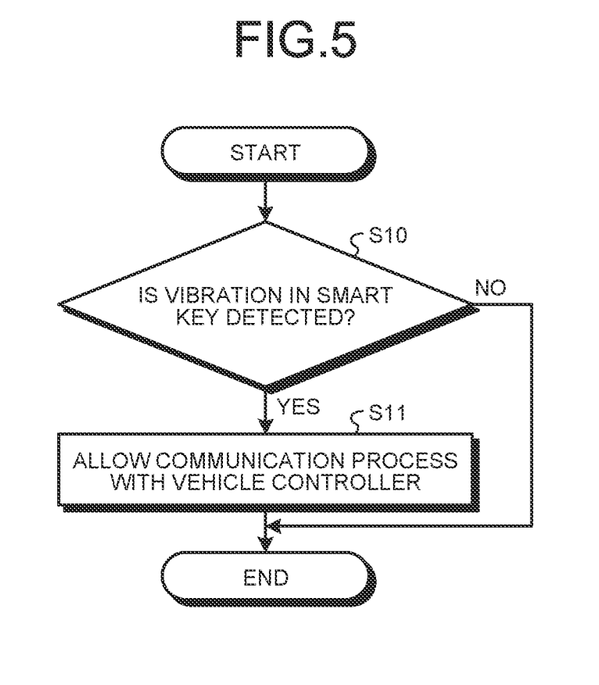
FIG. 5 is a flowchart illustrating a processing procedure to be executed by the smart key.

Next, a specific processing procedure in the smart key 10 that is a communication device will be explained with reference to FIG. 5. FIG. 5 is a flowchart illustrating a processing procedure to be executed by the smart key 10. The process is repeatedly executed in a started-up state of the smart key 10.

As illustrated in FIG. 5, the control unit 40 of the smart key 10 determines whether or not vibration in the smart key 10 is detected (Step S10). Specifically, the control unit 40 determines whether or not vibration in the smart key 10 is detected on the basis of a power generating state of the vibration powered generator 50 that is built in the smart key 10.

In a case where vibration in the smart key 10 is not detected (Step S10: No), in other words, in a case where the vibration powered generator 50 is not in a power generating state, the control unit 40 ends the processing. On the other hand, in a case where vibration of the smart key 10 is determined to be detected (Step S10: Yes), in other words, in a case where the vibration powered generator 50 is in a power generating state, the control unit 40 allows a communication process with the vehicle controller 100 for a predetermined time interval (Step S11), and ends the processing. Note that the predetermined time interval is set to a time interval obtained by adding a general time interval (namely, time interval to be capable of determining that operation is performed by legitimate user) from a time when vibration of the smart key 10 is detected, in other words, the user U picks up the smart key 10 in his/her hand for operation, to performance of an operation on the operation unit 20 to an offset, and is set to approximately ten seconds, for example.

In a case where an operation for the operation unit 20 by the user is detected during the above-mentioned predetermined time interval, the control unit 40 executes a communication process with the vehicle controller 100 in accordance with operation contents, transmission of a signal for ordering to lock the vehicle C and the like, for example. Note that each of the above-mentioned communication processes is executed by interrupt handling whose trigger is an operation of the operation unit 20 by the user U, for example.

As described above, the smart key (communication device) 10 according to the first embodiment includes the control unit 40. In a case where vibration of the smart key 10 is detected, the control unit 40 allows a communication process the vehicle controller (communication target device) 100. Therefore, it is possible to prevent needless communication processes.

Second Embodiment

Configuration of Smart Key According to Second Embodiment

Figure 6:
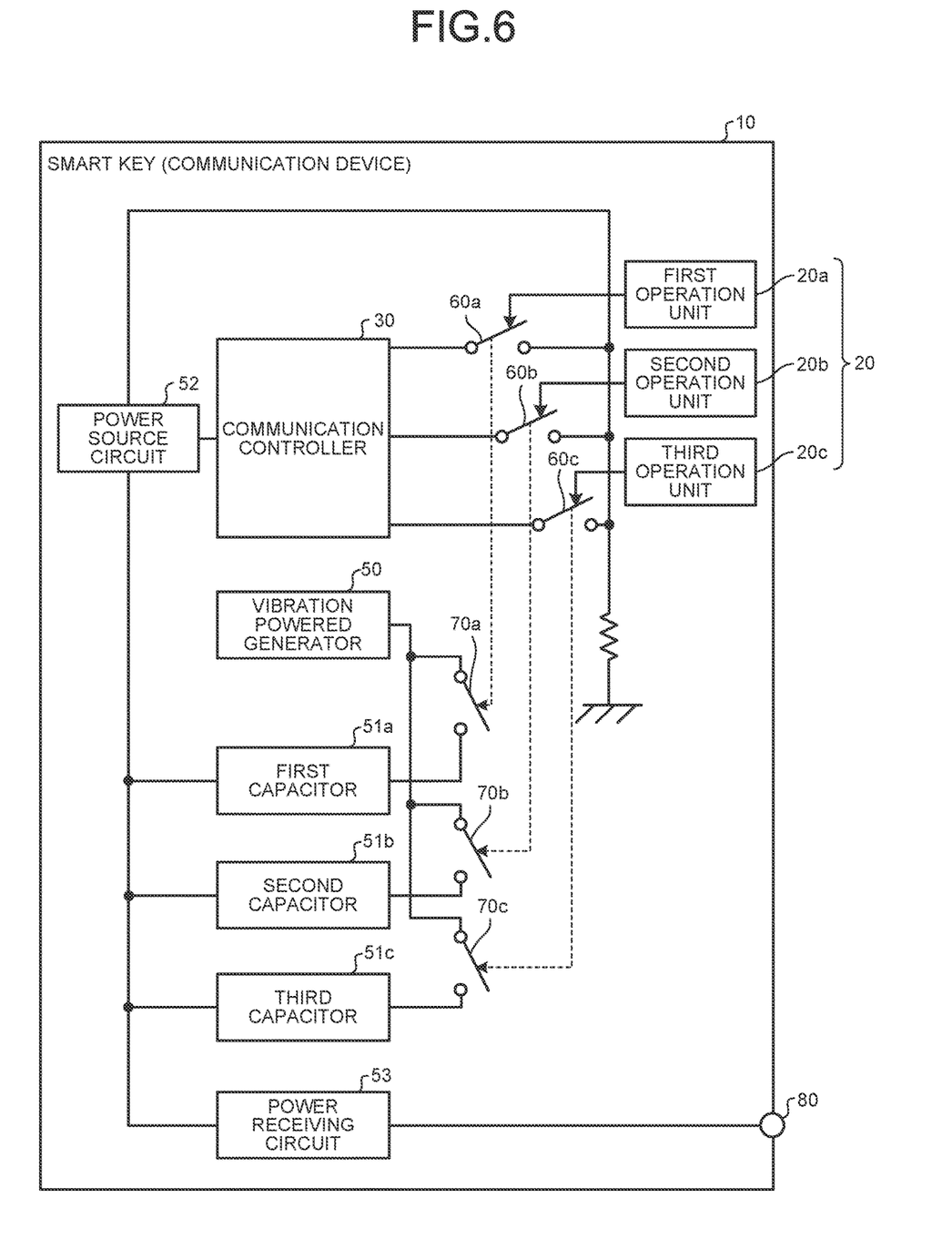
FIG. 6 is a block diagram illustrating a configuration example of a smart key according to a second embodiment.

Next, a configuration of the smart 10 according to a second embodiment will be explained with reference to FIG. 6. FIG. 6 is a block diagram illustrating a configuration example of the smart key 10 according to the second embodiment. Note that configuration elements common those according to the first embodiment are provided with the same reference symbols, and explanation thereof is omitted.

As illustrated in FIG. 6, in the second embodiment, the capacitors 51 and the cooperation switches 70 are respectively provided in correspondence with the plurality of operation units 20 (first, second, and third operation units 20a, 20b, and 20c).

Specifically, the plurality of capacitors 51 are provided in accordance with the plurality of operation units 20, and store therein electric power needed for executing corresponding communication processes. In a case of the present example, the capacitor 51 includes a first capacitor 51a, a second capacitor 51b, and a third capacitor 51c.

A capacitor having a capacity capable of storing therein electric power needed for execution of a communication process corresponding to the first operation unit 20a is employed for the first capacitor 51a. A capacitor having a capacity capable of storing therein electric power needed for execution of a communication process corresponding to the second operation unit 20b is employed for the second capacitor 51b. A capacitor having a capacity capable of storing therein electric power needed for execution of a communication process corresponding to the third operation unit 20c is employed for the third capacitor 51c.

First to third cooperation switches 70a to 70c are respectively interposed between the vibration powered generator 50 and capacitors 51a to 51c. The first cooperation switch 70a is a switch that cooperates with the above-mentioned first switch 60a. Similarly, the second cooperation switch 70b is a switch that cooperates with the second switch 60b, and the third cooperation switch 70c is a switch that cooperates with the third switch 60c.

Cooperative operations between the first to third switches 60a to 60c (first to third operation units 20a to 20c) and the first to third cooperation switches 70a to 70c are similar to the cooperative operations between the first to third switches 60a to 60c (first to third operation units 20a to 20c) and the cooperation switch 70 according to the first embodiment illustrated in FIG. 2.

In the smart key 10 according to the second embodiment configured as described above, electric power having an amount capable of executing a communication process corresponding to the above-mentioned operation is supplied from the capacitor 51 according to the operated operation unit 20 to the communication controller 30. A capacity of each of the capacitors 51 does not become too large with respect to an electric power amount needed for a corresponding communication process (able to be individually set to appropriate capacity), and thus a charging time interval does not become unnecessarily long, so that it is possible to prevent delay of electric-power supply to the communication controller 30. Thus, the smart key 10 according to the second embodiment is capable of reliably and stably executing a communication process.

When a specific operation example is exemplified, in a case where the first operation unit 20a receives a user operation, the first switch 60a is turned ON, the first cooperation switch 70a is also turned ON in cooperation therewith, electric power generated by the vibration powered generator 50 is stored in the first capacitor 51a. In this case, the user U has the smart key 10 in his/her hand and operates (for example, pushes) the first operation unit 20a, and thus the smart key 10 (vibration powered generator 50) is vibrating, and the vibration powered generator 50 is in a power generating state.

The power source circuit 52 supplies power-source electric power to the communication controller 30 by using the electric power stored in the first capacitor 51a, and further applies voltages to terminals of the first to third switches 60a to 60c on an opposite side of the communication controller 30. In this case, the first switch 60a alone is turned ON (second and third switches 60b and 60c are turned OFF), and a terminal of the first switch 60a alone of the terminals of the switches 60 on a side of the communication controller 30 has a high voltage (voltage applied by power source circuit 52).

The communication unit 31 is controlled such that the communication controller 30 to which power-source electric power is supplied is configured to start to operate, recognize a voltage of each input to which the corresponding switch 60 is connected, detect a user operation of the first operation unit 20a, and transmit, to the vehicle C, a locking instruction signal of a door of the vehicle C which is an operation instruction signal corresponding to the first operation unit 20a.

Thus, in a case where there presents an operation for the first operation unit 20a, the smart key 10 uses electric power from the first capacitor 51a (whose capacity is set to appropriate one) whose capacity is appropriate for electric power amount needed for a communication process corresponding to the first operation unit 20a. Therefore, electric power whose amount is sufficient for a communication process corresponding to the first operation unit 20a is provided to the communication controller 30 without delay, and thus the communication controller 30 is capable of reliably and stably executing the communication process.

Third Embodiment

Configuration of Smart Key According to Third Embodiment

Figure 7:
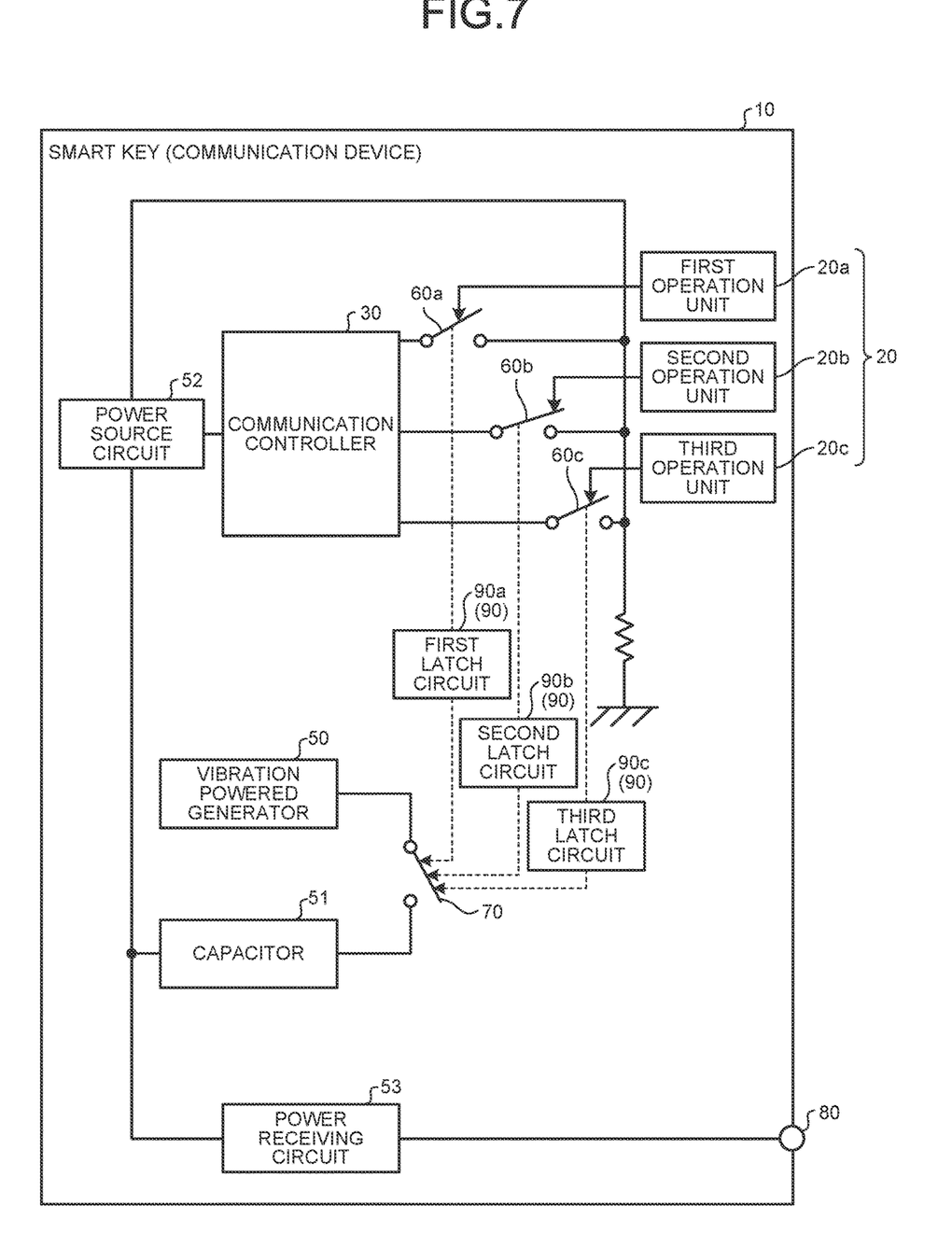
FIG. 7 is a block diagram illustrating a configuration example of a smart key according to a third embodiment.

Next, a configuration of the smart key 10 according to a third embodiment will be explained with reference to FIG. 7. FIG. 7 is a block diagram illustrating a configuration example of the smart key 10 according to the third embodiment. Note that configuration elements common to those according to the first embodiment are provided with the same reference symbols, and explanation thereof omitted.

As illustrated in FIG. 7, in the third embodiment, a plurality of latch circuits 90 is provided in accordance with the plurality of operation units 20. Each of the plurality of latch circuits 90 keeps a corresponding output (in present embodiment, high voltage) for a predetermined time interval from a turning-ON operation of the corresponding switch 60. Next, an output of each of the latch circuits 90 controls a state of the cooperation switch 70 (cooperation switch 70 is turned ON when latch circuit 90 is high voltage). The latch circuit 90 is realized by a time-constant (charging and discharging) circuit and/or a timer, and the cooperation switch 70 is realized by a relay and/or a switching circuit.

In other words, when the first operation unit 20a is operated, a first latch circuit 90a turns ON the cooperation switch 70 for a time interval set in the first latch circuit 90a (corresponding to time interval needed for storing electric power required for execution of communication process corresponding to first operation unit 20a) in accordance with transit to an ON state of the first switch 60a. Thus, the capacitor 51 is charged with electric power generated by the vibration powered generator 50 via the cooperation switch 70 for a time interval that is set in the first latch circuit 90a.

A second latch circuit 90b and a third latch circuit 90c also operate similarly to the aforementioned, and the capacitor 51 stores therein electric power needed for execution of communication processes corresponding to the second operation unit 20b and the third operation unit 20c.

The power source circuit 52 supplies power-source electric power to the communication controller 30 by using electric power stored in the capacitor 51, and applies voltage to terminals of the first to third switches 60a to 60c on an opposite side of the communication controller 30. In this case, the operated switch 60 alone is turned ON, and thus only a terminal of the operated switch 60 of terminals of the switches 60 on a side of the communication controller 30 has a high voltage (voltage applied by power source circuit 52).

The communication unit 31 is controlled such that the communication controller 30 to which power-source electric power is supplied starts to operate, voltages of inputs connected to the switches 60 are recognized, the operated operation unit 20 by the user U is detected, an operation instruction signal corresponding to the corresponding operation unit 20, for example, a locking instruction signal of a door of the vehicle C is transmitted to the vehicle C.

In the smart key 10 according to the third embodiment, an electric power amount with which the capacitor 51 charged is set in accordance with the operated operation unit 20, in other words, is set in accordance with communication processing details executed by the communication controller 30, and thus the capacitor 51 is charged with an appropriate electric power amount to be provided to the communication controller 30. Thus, the communication controller 30 is capable of stably and reliably executing a communication process.

When a specific operation example is exemplified, in a case where the first operation unit 20a receives a user operation, the first switch 60a is turned ON, the first latch circuit 90a turns ON the cooperation switch 70 for a time interval that is set in the first latch circuit 90a in cooperation therewith, and electric power generated by the vibration powered generator 50 is stored in the capacitor 51. In this case, the user U has the smart key 10 in his/her hand and operates (for example, pushes) the first operation unit 20a, and thus the smart key 10 (vibration powered generator 50) is vibrating, and the vibration powered generator 50 is in a power generating state.

The power source circuit 52 supplies power-source electric power to the communication controller 30 by using the electric power stored in the capacitor 51, and further applies voltage to terminals of the first to third switches 60a to 60c on an opposite side of the communication controller 30. In this case, the first switch 60a alone is turned ON (second and third switches 60b and 60c are turned OFF) and a terminal of the first switch 60a alone of the terminals of the switches 60 on a side of the communication controller 30 has a high voltage (voltage applied by power source circuit 52).

The communication unit 31 is controlled such that the communication controller 30 to which power-source electric power is supplied is configured to start to operate, recognize a voltage of each input to which the corresponding switch 60 is connected, detect a user operation of the first operation unit 20a, and transmit, to the vehicle C, a locking instruction signal of a door of the vehicle C which is an operation instruction signal corresponding to the first operation unit 20a.

In this case, charging is executed on the capacitor 51 for a time interval (corresponding, to time interval for charging of electric power amount needed for communication process executed by communication controller 30 corresponding to first operation unit 20a) that is set in the first latch circuit 90a. In other words, a charge amount of the capacitor 51 is set in accordance with communication processing details executed by the communication controller 30, and thus the capacitor 51 is charged with an appropriate electric power amount to be provided to the communication controller 30.

Fourth Embodiment

Configuration of Smart Key According to Fourth Embodiment

Figure 8:
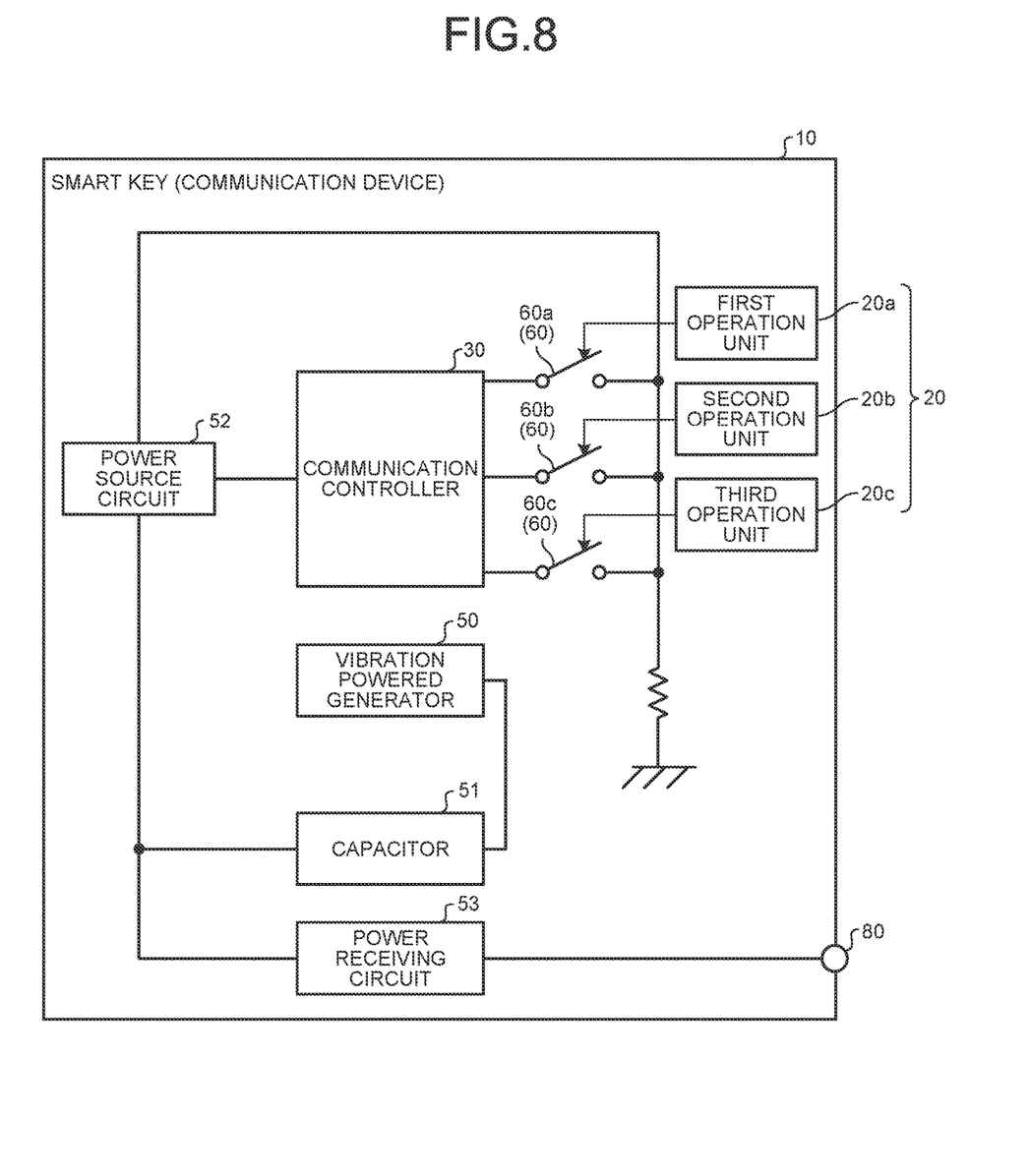
FIG. 8 is a block diagram illustrating a configuration example of a smart key according to a fourth embodiment.

Next, a configuration of the smart key 10 according to a fourth embodiment will be explained with reference to FIG. 8. FIG. 8 is a block diagram illustrating a configuration example of the smart key 10 according to the fourth embodiment. Note that configuration elements common to those according to the first embodiment are provided with the same reference symbols, and explanation thereof is omitted.

As illustrated in FIG. 8, in the fourth embodiment, a configuration is employed in which the vibration powered generator 50 is directly connected to the capacitor 51 (in which cooperation switch 70 illustrated in FIG. 2 is deleted). In other words, the configuration is one in which the communication controller 30 is operated by electric power generated by the vibration powered generator 50 when the smart key 10 is vibrated (for example, user U picks up smart key 10 in his/her hand and operates it), and the communication controller 30 causes the communication unit 31 to transmit, to the vehicle C, an instruction signal corresponding to the operation unit 20 operated by the user U. In a case of this configuration, a capacity of the capacitor 51 and/or a charging/discharging time constant of a charging/discharging circuit of the capacitor 51 are adjusted so that a storage amount of the capacitor 51 and/or a holding time interval of stored electric power are set to appropriate values (are set by experiments and the like at design).

Note that operations thereof are similar to those according to the first embodiment illustrated in FIG. 2 (similar to those in case where cooperation switch 70 is always turned ON), detailed explanation is omitted.

In the above-mentioned embodiments, the smart key 10 is configured to detect vibration on the basis of a power generating state of a vibration powered generator; however, not limited thereto. In other words, for example, the smart key 10 may be configured to include a vibration sensor so as to detect vibration on the basis of an output from the vibration sensor.

Configurations below also belong to the technical scope of the present disclosure.

(1)
A communication device including: a controller configured to: in a case where vibration of the communication device is detected, allow execution of a communication process with a communication target device.

(2)
The communication device according to (1) further including:
a vibration powered generator configured to:
generate electric power by the vibration of the communication device; and
supply electric power to the communication device, wherein
the controller is further, configured to:
detect the vibration based on a power generating state of the vibration powered generator.

(3)
The communication device according to (2) further including:
a plurality of operation units that receives a user operation ordering execution of the communication process;
an electric condenser that stores therein electric power generated by the vibration powered generator; and
a cooperation switch that is turned into an ON state in response to an operation of the plurality of operation units to connect the vibration powered generator and the electric condenser to each other, and turns the electric condenser into a charge state, wherein
electric power is supplied from the electric condenser to the communication device.

(4)
The communication device according to (3), wherein
the electric condenser and the cooperation switch are provided for each of the plurality of operation units.

(5)
The communication, device according to (3) or (4), wherein
a discharge circuit having a predetermined time constant is connected to the electric condenser.

(6)
A smart key device that wirelessly transmits an operation instruction signal to a vehicle, the device including:
a vibration powered generator that executes electric-power supply by using vibration of the smart key device as power source; and
a communication controller configured to:
transmit an operation instruction signal to the vehicle by using electric power generated by the vibration powered generator.

(7)
The smart key device according to (6) further including:
a power receiving unit that receives electric power supplied from the vehicle, wherein
the communication controller is further configured to:
by using the electric power received by the power receiving unit, transmit an instruction signal that continuously transmitted for continuing driving of the vehicle.

(8)
A smart key system including:
a portable smart key device; and
an on-vehicle device provided in a vehicle, wherein
the on-vehicle device includes a vehicle controller,
the vehicle controller is configured to:
detect an operation state of a vehicle-side operation unit provided in the vehicle; and
control the vehicle in accordance with a data communication situation with the smart key device and an operation state of the vehicle-side operation unit, and
the smart key device includes a controller configured to:
in a case where vibration of the smart key device is detected, allow a communication process with the on-vehicle device.

(9)
A smart key system including:
a portable smart key device; and
an on-vehicle device provided in a vehicle wherein
the on-vehicle device includes:
a vehicle-side operation detecting unit that detects an operation state of a vehicle-side operation unit provided in the vehicle; and
a vehicle controller that controls the vehicle in accordance with a data communication situation with the smart key device and a detection content by the vehicle-side operation detecting unit, and
the smart key device includes:
a vibration powered generator that generates electric power by vibration of the smart key device; and
a communication controller that communicates with the on-vehicle device by using electric power generated by the vibration powered generator.

(10)
A communication method of a communication device including:
detecting vibration of the communication device; and
in a case where vibration of the communication device is detected, allowing a communication process with a communication target device.

Additional advantages and modifications will readily occur to those skilled in the art. Therefore, the invention in its broader aspects is not limited to the specific details and representative embodiment shown and described herein. Accordingly, various modifications may be made without departing from the spirit or scope of the general inventive concept as defined by the appended claims and their equivalents.

What is claimed is:
1. A communication device comprising:
a processor programmed to:

in a case where vibration of the communication device is detected, allow execution of a communication process with a communication target device;
a vibration powered generator configured to:
generate electric power by the vibration of the communication device; and
supply electric power to the communication device, wherein
the processor is further programmed to:
detect the vibration based on a power generating state of the vibration powered generator and
the communication device further comprises:
a plurality of operation buttons that receives a user operation ordering execution of the communication process;
an electric condenser that stores therein electric power generated by the vibration powered generator; and
a cooperation switch that is turned into an ON state in response to an operation of the plurality of operation buttons to connect the vibration powered generator and the electric condenser to each other, and turns the electric condenser into a charge state, wherein
electric power is supplied from the electric condenser to the communication device.

2. The communication device according to claim 1, wherein
the electric condenser and the cooperation switch are provided for each of the plurality of operation buttons.

3. The communication device according to claim 2, wherein
a discharge circuit having a predetermined time constant is connected to the electric condenser.

4. The communication device according to claim 1, wherein
a discharge circuit having a predetermined time constant is connected to the electric condenser.

5. A smart key device that wirelessly transmits an operation instruction signal to a vehicle, the device comprising:
a vibration powered generator that executes electric-power supply by using vibration of the smart key device as power source; and
a communication controller including a processor programmed to:
transmit an operation instruction signal to the vehicle by using electric power generated by the vibration powered generator, wherein
the smart key device is portable, and is included in a smart key system, and
the smart key device further comprising a controller including a processor programmed to:
in a case where vibration of the smart key device is detected, allow execution of a communication process with an on-vehicle device provided in a vehicle, the on-vehicle device including a vehicle controller including a processor programmed to: detect an operation state of an operation switch is provided in a vehicle; and further to control the vehicle in accordance with a data communication situation of the smart key and an operation state of the operation switch.

6. The smart key device according to claim 5 further comprising:
a power receiving circuit that receives electric power supplied from the vehicle, wherein
the processor of the communication controller is further programmed to:
by using the electric power received by the power receiving circuit, transmit an instruction signal that is continuously transmitted for continuing driving of the vehicle.

7. A smart key device that wirelessly transmits an operation instruction signal to a vehicle, the device comprising:
a vibration powered generator that executes electric-power supply by using vibration of the smart key device as power source; and
a communication controller including a processor programmed to:
transmit an operation instruction signal to the vehicle by using electric power generated by the vibration powered generator, wherein
the smart key device is portable, and is included in a smart key system,
the vibration powered generator generates electric power by vibration of the smart key, and
the communication controller includes a processor programmed to:
by using electric power generated by the vibration powered generator, communicate with an on-vehicle device provided in a vehicle, the on-vehicle device including a vehicle controller including a processor programmed to: detect an operation state of an operation switch is provided in the vehicle; and further to control the vehicle in accordance with a data communication situation of the smart key and an operation state of the operation switch.

* * * * *